(12) United States Patent
Huang et al.

(10) Patent No.: US 8,907,705 B2
(45) Date of Patent: Dec. 9, 2014

(54) FULLY INTEGRATED CIRCUIT FOR GENERATING A RAMP SIGNAL

(71) Applicant: STMicroelectronics (Shenzhen) R&D Co. Ltd., Nanshan, Shenzhen (CN)

(72) Inventors: Tao Tao Huang, Shenzhen (CN); Meng Wang, Shenzhen (CN)

(73) Assignee: STMicroelectronics (Shenzhen) R&D Co. Ltd., Shenzhen (CN)

( * ) Notice: Subject to any disclaimer, the term of this patent is extended or adjusted under 35 U.S.C. 154(b) by 111 days.

(21) Appl. No.: 13/648,557

(22) Filed: Oct. 10, 2012

(65) Prior Publication Data

US 2013/0169324 A1 Jul. 4, 2013

(30) Foreign Application Priority Data

Dec. 31, 2011 (CN) .......................... 2011 1 0461953

(51) Int. Cl.
*H03K 4/02* (2006.01)
*H03K 4/06* (2006.01)

(52) U.S. Cl.
USPC ........... 327/126; 327/127; 327/131; 327/132; 327/135; 327/137

(58) Field of Classification Search
CPC ............. H03K 4/06; H03K 4/48; H03K 4/50; H03K 4/501; H03K 4/502
USPC .................. 327/126, 127, 131, 132, 135, 137
See application file for complete search history.

(56) References Cited

U.S. PATENT DOCUMENTS

| | | | | |
|---|---|---|---|---|
| 4,736,118 A * | 4/1988 | Fischer | ......................... | 327/175 |
| 5,760,623 A * | 6/1998 | Hastings | ....................... | 327/137 |
| 5,965,958 A * | 10/1999 | Harwood | ...................... | 307/125 |
| 6,369,665 B1 * | 4/2002 | Chee et al. | ..................... | 331/143 |
| 7,919,998 B2 * | 4/2011 | Stanley | ......................... | 327/131 |
| 2005/0162215 A1 * | 7/2005 | Chang et al. | .................. | 327/538 |
| 2009/0085617 A1 * | 4/2009 | Ceballos | ....................... | 327/131 |

* cited by examiner

*Primary Examiner* — Lincoln Donovan
*Assistant Examiner* — Colleen O Toole
(74) *Attorney, Agent, or Firm* — Gardere Wynne Sewell LLP

(57) ABSTRACT

A fully integrated ramp generator circuit includes a first current generator that sources current to first capacitor through a first transistor that is gate controlled by the complement of a periodic signal. The ramping voltage stored on the first capacitor is buffered to an output node as a ramp output signal. A second transistor couples the output node to the first current generator and is gate controlled by the periodic signal. The periodic signal is generated at the output of a flip-flop that receives an input clock signal and reset signal. The reset signal is generated by a comparator circuit operable to compare the voltage on a second capacitor to a reference. The second capacitor is charged by a second current source and discharged by a third transistor that is gate controlled by the periodic signal.

18 Claims, 6 Drawing Sheets

US 8,907,705 B2

FULLY INTEGRATED CIRCUIT FOR GENERATING A RAMP SIGNAL

PRIORITY CLAIM

This application claims priority from Chinese Application for Patent No. 201110461953.4 filed Dec. 31, 2011, the disclosure of which is hereby incorporated by reference.

TECHNICAL FIELD

The present invention relates to integrated circuits and, more particularly, to an integrated circuit configured to generate a ramp signal.

BACKGROUND

Circuits for generating ramp signals, for use (for example) in soft-start circuitry, are well known in the art. These circuits may include a capacitor, but in many cases that capacitor is of a size that is not readily integratable. There is a need in the art for a ramp generator circuit that can be fully integrated.

Prior art ramp generator circuits are also often limited to a single (fixed) ramp slope. There is a need in the art for a ramp generator circuit that supports an adjustable ramp slope.

SUMMARY

In an embodiment, a circuit, comprises: a first current generator coupled between a first reference voltage node and a first intermediate node; a first transistor source-drain coupled between the first intermediate node and a second intermediate node; a second transistor source-drain coupled between the first intermediate node and an output node; and a buffer circuit having an input coupled to the second intermediate node and an output coupled to the output node; a first capacitance coupled between the second intermediate node and a second reference voltage node. The first transistor has a gate coupled to receive a periodic signal and the second transistor has a gate coupled to receive a complement of the periodic signal.

In an embodiment, a generator circuit configured to generate the periodic signal comprises: a logic circuit configured to sense an edge of a clock signal and change an output periodic signal from a first logic state to a second logic state and further operable to respond to a reset signal and change the output periodic signal from the second logic state back to the first logic state; and a timing circuit configured to generate the reset signal.

In an embodiment, the timing circuit comprises: a second current generator coupled between the first reference voltage node and a third intermediate node; a third transistor source-drain coupled between the third intermediate node the second reference voltage node, said third transistor having a gate configured to receive the periodic signal; a second capacitance coupled between the third intermediate node and the second reference voltage node; and a first comparator circuit having a first input coupled to the third intermediate node, a second input configured to receive a first threshold and an output configured to generate the reset signal.

In an embodiment, the circuit further comprises: a fourth transistor source-drain coupled between the second intermediate node the second reference voltage node; and a second comparator circuit having a first input coupled to the output node, a second input configured to receive a second threshold and an output configured to generate a signal for application to a gate of the fourth transistor.

In an embodiment, a circuit comprises: a first capacitor; a first transistor; a first current generator operable to source current to the first capacitor through the first transistor, wherein the first transistor is gate controlled by the complement of a periodic signal; a buffer configured to buffer a ramping voltage stored on the first capacitor to an output node as a ramp output signal; a second transistor configured to couple the output node to the first current generator, wherein the second transistor is gate controlled by the periodic signal; a flip-flop having an output configured to generate the periodic signal from an input clock signal and a reset signal; a second current source; a second capacitor charged by the second current source; a third transistor configured to discharge the second capacitor in response to the periodic signal; and a comparator circuit operable to compare a voltage on the second capacitor to a reference and generate the reset signal.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
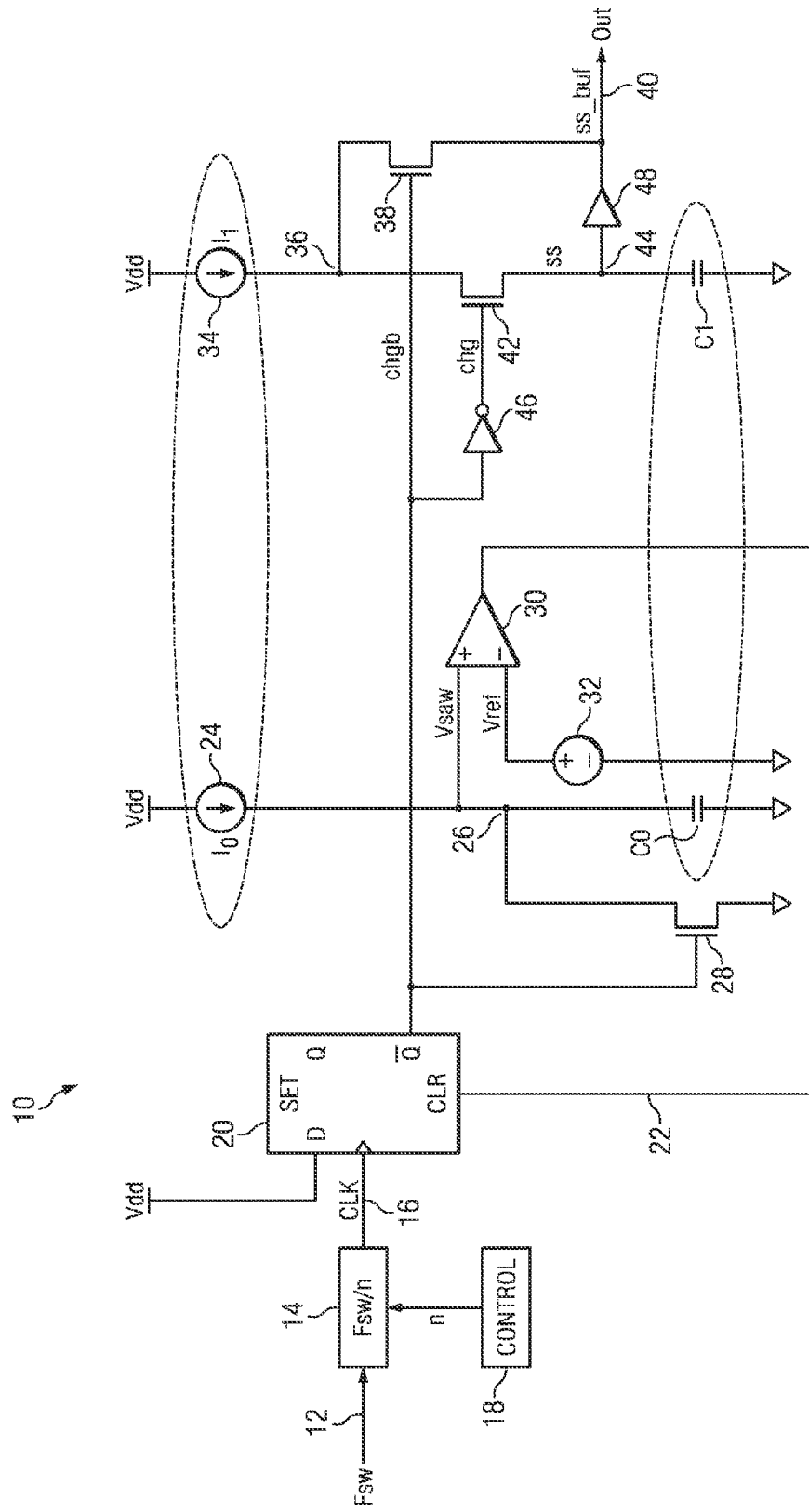
FIG. 1 is a circuit diagram of a ramp generator circuit.

Reference is now made to FIG. 1 which is a circuit diagram of a ramp generator circuit 10. The circuit 10 includes an input node 12 which receives a clock signal Fsw. A programmable divider circuit 14 divides the clock signal Fsw to generate a divided clock signal CLK on line 16. The programmable divider circuit 14 implements a divide by n clock division. A control circuit 18 supplies the programmable divider circuit 14 with the divisor n value, where the divisor n value is selectable by the control circuit. As will be discussed in more detail below, the selection of the divisor n value sets a slope of a generated ramp signal output by the circuit 10.

The circuit 10 further includes a flip-flop circuit 20. The preferred implementation uses a D-type flip flop for the flip-flop circuit 20. The data "D" input of the D-type flip flop circuit 20 is connected to a node associated with a first reference voltage (in this case, a high reference voltage Vdd). The clear "CLR" input of the D-type flip flop circuit 20 receives a reset signal on line 22. The clock ">" input of the D-type flip flop circuit 20 receives the divided clock signal CLK on line 16. The D-type flip flop circuit 20 includes two outputs labeled "Q" and "Q(bar)." In the configuration of the circuitry shown, the output signal at the Q(bar) output of the D-type flip flop circuit 20 is a signal "chgb" that pulses logic low coincident with the leading edge of the divided clock signal CLK. The length of each low pulse in the signal chgb is determined by the reset signal on line 22. When the reset signal transitions to logic high (in response to a condition to be described below), the D-type flip flop circuit 20 is reset and the Q(bar) output signal chgb returns to logic high. Thus, the D-type flip flop circuit 20 functions as a sensing circuit operable to sense the leading edge of the divided clock signal CLK and produce a pulse signal in response to that detection, the pulse signal being terminated by receipt of the reset signal. The Q output of the D-type flip flop circuit 20 produces a signal which is complementary to the signal chgb at the Q(bar) output. That Q output and the signal at the Q output are not used in the circuit 10. Additionally, the "SET" input of the D-type flip flop circuit 20 is not used in the circuit 10.

The circuit 10 further includes a first current source 24 connected to the Vdd reference voltage node and configured to output a current $I_0$. The current $I_0$ is supplied to a node 26. The drain terminal of an n-channel MOS transistor 28 is coupled to node 26. A source terminal of transistor 28 is connected to a node associated with a second reference voltage (in this case a low reference voltage such as ground). A gate of the transistor 28 is coupled to receive the signal chgb from the Q(bar) output of the D-type flip flop circuit 20. A first capacitor C0 is coupled between the node 26 and the ground reference voltage node.

The circuit 10 also includes a voltage comparator circuit 30. A positive input terminal of the voltage comparator circuit 30 is coupled to receive a voltage signal Vsaw supplied at node 26. The voltage Vsaw is accordingly the voltage stored across the plates of the first capacitor C0. A negative input terminal of the voltage comparator circuit is coupled to receive a reference voltage signal Vref (a comparison threshold) supplied by a reference voltage generator circuit 32. The output of the voltage comparator circuit 30 is coupled to line 22, and thus the voltage comparator circuit generates and outputs the reset signal which is applied to the clear CLR input of the D-type flip flop circuit 20.

The first current source 24, transistor 28, capacitor C0, voltage comparator circuit 30 and reference voltage generator circuit 32 together function as a timing circuit configured to set the length (width) of the pulse within the periodic signal chgb. The selection of the value of the reference voltage Vref, the value of the capacitor C0 and current $I_0$ together affect setting of the pulse width for signal chgb.

The circuit 10 further includes a second current source 34 connected to the Vdd reference voltage node and configured to output a current $I_1$. The current $I_1$ is supplied to a node 36. The drain terminal of an n-channel MOS transistor 38 is coupled to node 36. A source terminal of transistor 38 is connected to a node 40 (at which an output (buffered) ramp signal ss_buf is generated). A gate terminal of transistor 38 is coupled to receive the signal chgb from the Q(bar) output of the D-type flip flop circuit 20. The drain terminal of an n-channel MOS transistor 42 is coupled to node 36. A source terminal of transistor 38 is connected to a node 44 (at which a non-buffered ramp signal ss is generated). A gate terminal of transistor 42 is coupled to receive a signal chg. As illustrated, the signal chg is generated by an inverter circuit 46 having an input coupled to receive the signal chgb from the Q(bar) output of the D-type flip flop circuit 20. The inverter circuit 46 functions to introduce a slight delay between the switching instants of the chgb and chg signals. If this delay is not needed, the signal chg may alternatively be obtained from the Q output of the D-type flip flop circuit 20. Additional circuitry could be added between the chgb signal and the gate of transistors 38 and 42 for the purpose of reducing charge injection and addressing clock feedthrough. Node 44 is coupled to node 40 via a non-inverting buffer circuit 48 having an input coupled to node 44 and an output coupled to node 40. A second capacitor C1 is coupled between the node 44 and the ground reference voltage node.

The second current source 34, transistor 38, transistor 42, inverter circuit 46 and capacitor C1 together function as a continuous mode charge circuit operable in response to a received periodic signal chgb to produce a ramping voltage signal.

Operation of the circuit 10 will now be described with reference to the timing diagram shown in FIG. 2. A clock signal Fsw is received. The programmable divider circuit 14 divides the clock signal Fsw to generate a divided clock signal CLK (having a value of Fsw/n). In the example illustrated in FIG. 2, n=8. When the chgb signal generated by the Q(bar) output of the D-type flip flop circuit 20 is logic high, the transistor 28 is turned on and this shunts the first capacitor to ground. The Vsaw voltage at node 26 is accordingly at ground. However, coincident with D-type flip flop circuit 20 detection of the rising edge of the CLK signal (100), the chgb signal generated by the Q(bar) output of the D-type flip flop circuit 20 goes to logic low (102) releasing the shunt provided by transistor 28 and allows the first current $I_0$ to charge capacitor C0. This charging of capacitor C0 from a constant current source produces a linear increase in the Vsaw voltage (reference 104). The comparator 30 compares the Vsaw voltage to the reference voltage Vref. When the Vsaw voltage reaches the reference voltage Vref (comparison threshold), the output of the comparator 30 changes state and a reset signal is applied to the CLR input of the D-type flip flop circuit 20. This causes the Q(bar) output of the D-type flip flop circuit 20 to change state from logic low to logic high (chgb signal reference 106). The transistor 28 then turns on and clamps the Vsaw voltage to ground (reference 108).

The foregoing operation will thus be understood to generate a periodic signal chgb whose duty cycle is determined by the first current $I_0$, the capacitance of the capacitor C0, and the value of the reference voltage Vref (comparison threshold). The period of the periodic signal chgb is determined by the rate of clock signal Fsw and the selected divisor value n.

Figure 2:
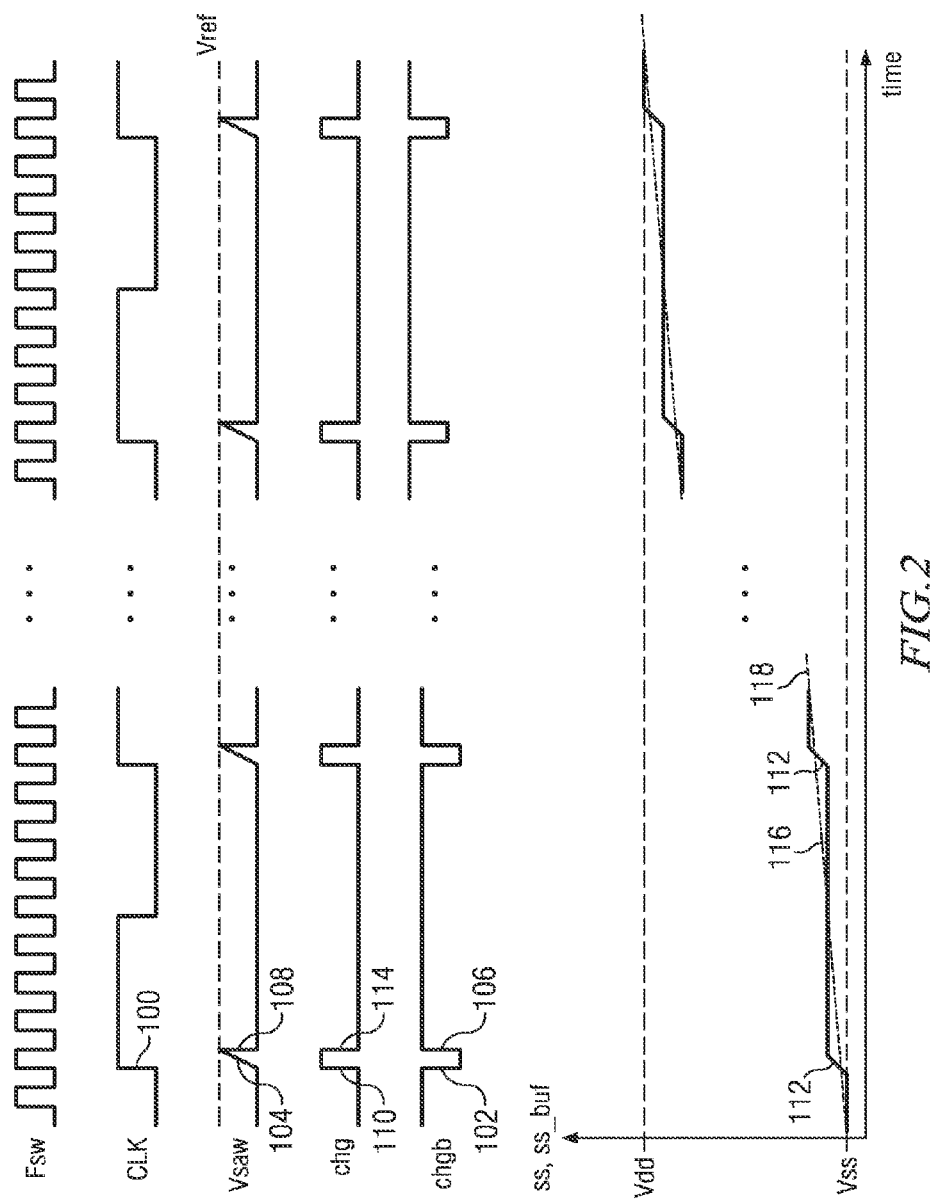
FIG. 2 is a timing diagram illustrating operation of the circuit of FIG. 1.

When the Q(bar) output (signal chgb) of the D-type flip flop circuit 20 changes state from logic high to logic low (reference 102), the signal chg changes state from logic low to logic high (reference 110) due to the operation of the inverter (with a slight delay not shown in FIG. 2). When signal chg goes high, this turns on transistor 42 and allows the second current $I_1$ to charge capacitor C1. This charging of capacitor C1 from a constant current source produces a linear increase in the ss voltage (reference 112) at node 44. Buffer 48 passes the ss voltage from node 44 to the ss_buf output at node 40. During this time, the signal chgb is logic low and thus transistor 38 is turned off (which disconnects node 40 from the second current source). When the Q(bar) output (signal chgb) of the D-type flip flop circuit 20 subsequently changes state from logic low to logic high (reference 106), the signal chg changes state from logic high to logic low (reference 114). At this point, transistor 42 turns off (thus disconnecting node 44 and the second capacitor C1 from the second current source), and the transistor 38 turns on (thus connecting node 40 to the second current source). The connection made by transistor 38 applies the ss (ss_buf) voltage to node 36. This permits the second current source to operate in "continuous mode" and reduce spiking and noise at node 44 due to transistor switching operations.

The foregoing process then repeats as the signals chgb and chg are periodic. Importantly, and in distinction to the operation with respect to the first capacitor C0, there is no operation to discharge the second capacitor C1 after each cycle. Rather, the ss voltage at node 44 will be substantially maintained (reference 116) by capacitor C1 (when the signal chgb is logic high and the signal chg is logic low). With each repetition of the process, due to cycling of the signals chgb and chg, transistor 42 is turned on to permit the second current source to source additional current to node 44 for storage in the capacitor C1 and thus increase (reference 112) the ss voltage at node 44. A stair step-like increasing voltage is produced at node 42 with signal ss and the output of the circuit 10 with signal ss_buf. The effect is essentially to produce from the circuit a highly linear increasing voltage ramp signal (generally represented by dotted line 118). The output signal ss_buf will continue to increase until reaching the supply voltage Vdd for the circuit. The value of the Vdd voltage can be changed to any reference voltage value having driver capability.

By matching the first and second current sources, and further by matching the first and second capacitors, it can be assured that the circuit, when in operation, will produce a substantially constant increase in ss_buf output voltage with each cycle for the periodic signal chgb. The circuit 10 will thus be immune to process corners.

Operation of the circuit 10 is best when delay in the comparator 30 is minimized.

As an exemplary implementation, the circuit 10 has been tested with first current $I_0$ equal to 20 uA, second current $I_1$ equal to 0.5 uA, C0 equal to 2 pF and C1 equal to 40 pF. Those skilled in the art recognize that the exemplary capacitance values permit integration of the capacitors with the other circuitry, thus obviating the need for an external capacitor connection. The circuit in this exemplary configuration took 800 cycles of the periodic signal chgb to ramp up the ss_buf signal to reach its final voltage.

Figure 3:
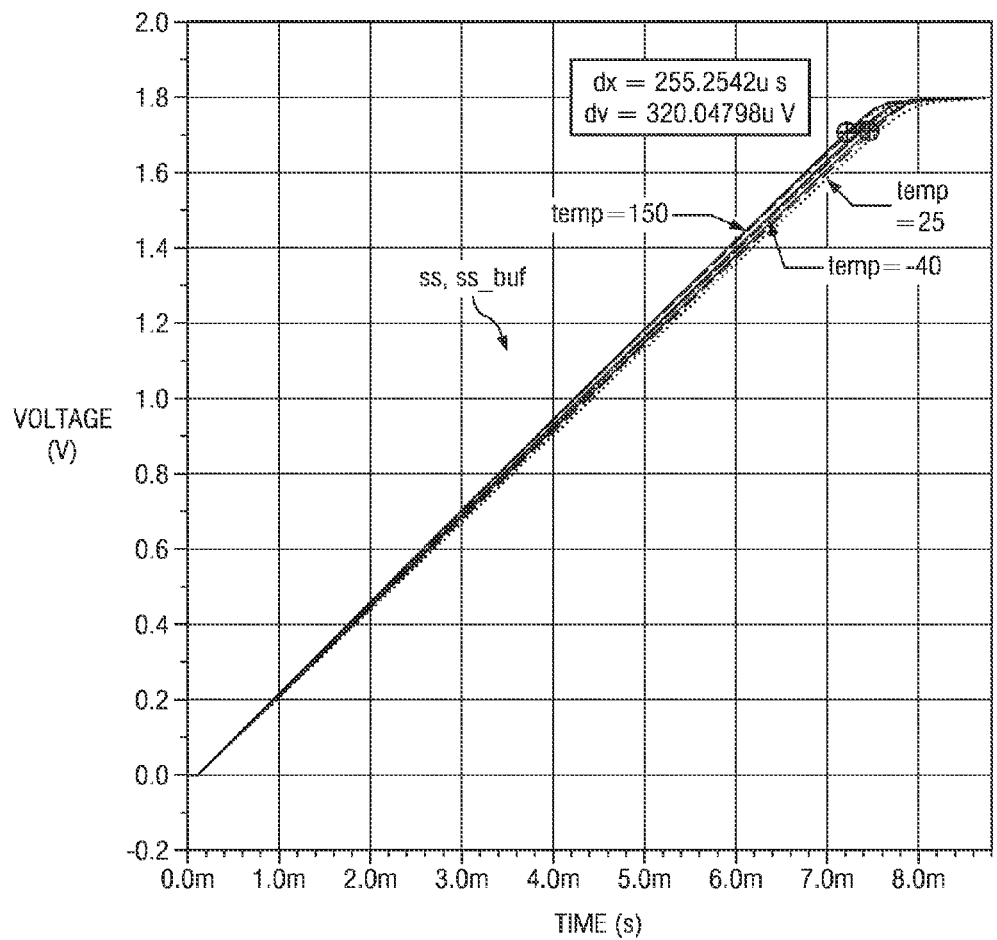
FIG. 3 illustrates an output waveform for a ramp signal produced by the circuit of FIG. 1.

The circuit 10 is furthermore relatively immune to changes in operating temperature. FIG. 3 shows a substantially identical performance of the circuit 10 in generating the output signal ss_buf at three different temperatures (−40, 25 and 150 degrees). The deviation in ramp-up time across the temperature range is about 255 usec.

It will be noted that changing the clock divisor n produces a corresponding change in the ramp slope. The smaller the value of n selected through the control circuit 18, the larger the ramp slope value.

A preferred use of the circuit 10 is as a one-time ramp generator circuit for use in a soft-start circuit functionality where the output ss_buf signal is a supply voltage for downstream circuit that must be ramped-up at start-up. It will be recognized, however, that the circuit 10 may have other uses.

Figure 4:
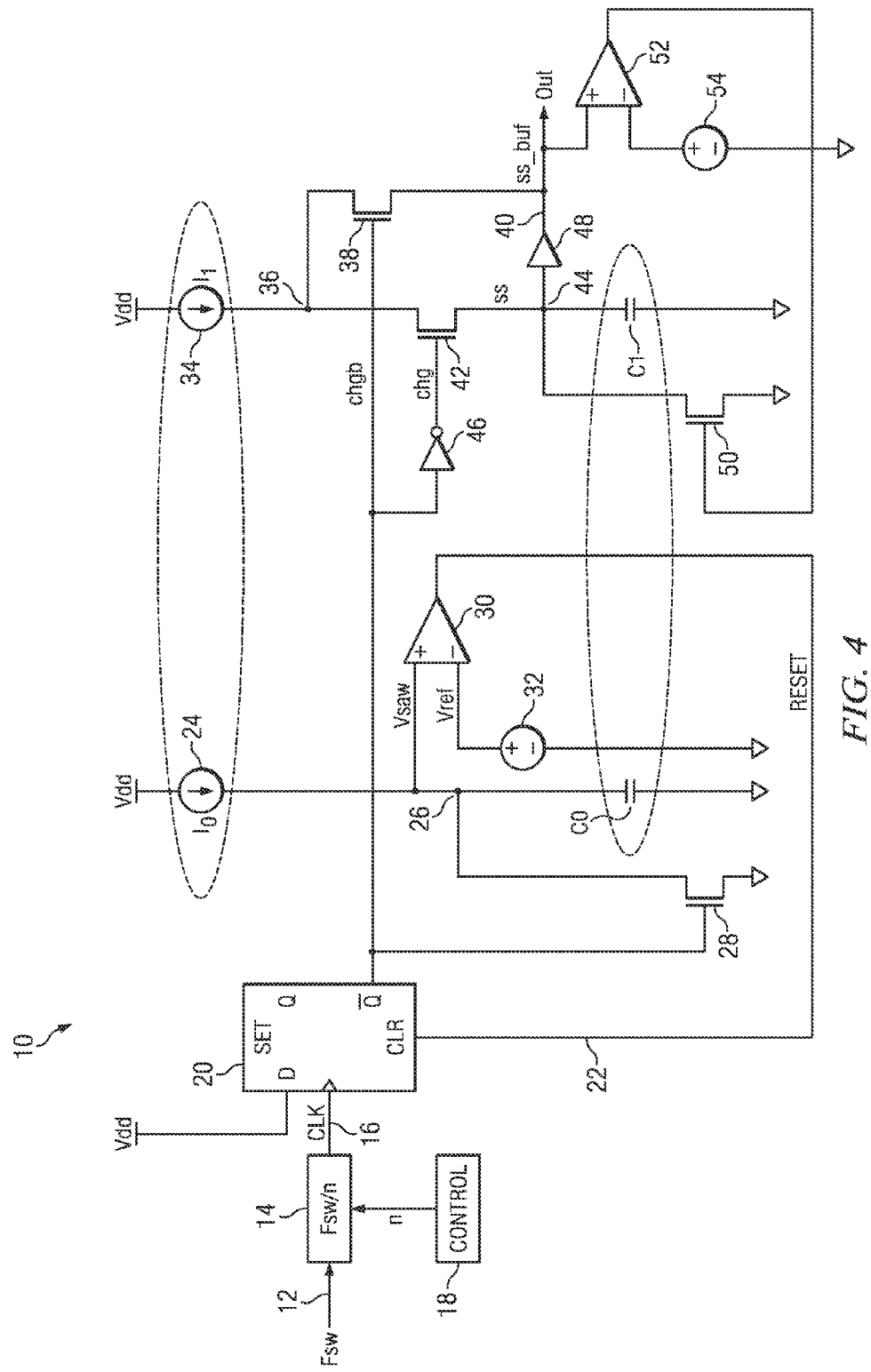
FIG. 4 is a circuit diagram of a ramp generator circuit supporting generation of a sawtooth waveform.

Additionally, although illustrated in FIG. 1 as generating a one-time ramp signal, those skilled in the art understand that the circuit could be used as a sawtooth waveform generator. Reference is made to FIG. 4. In such an implementation, a shunting transistor 50 could be added across the second capacitor C1 and actuated by a comparator 52 functionality (similar to that shown with comparator 30) to discharge the voltage stored by capacitor C1 each time the ss_buf signal ramp voltage meets a certain threshold value set by a voltage reference 54 (a comparison threshold). Additionally, in this sawtooth waveform generator implementation, the control circuit could be used to adjust the slope of the increasing voltage stored at the second capacitor by changing the divisor n value.

Figure 5:
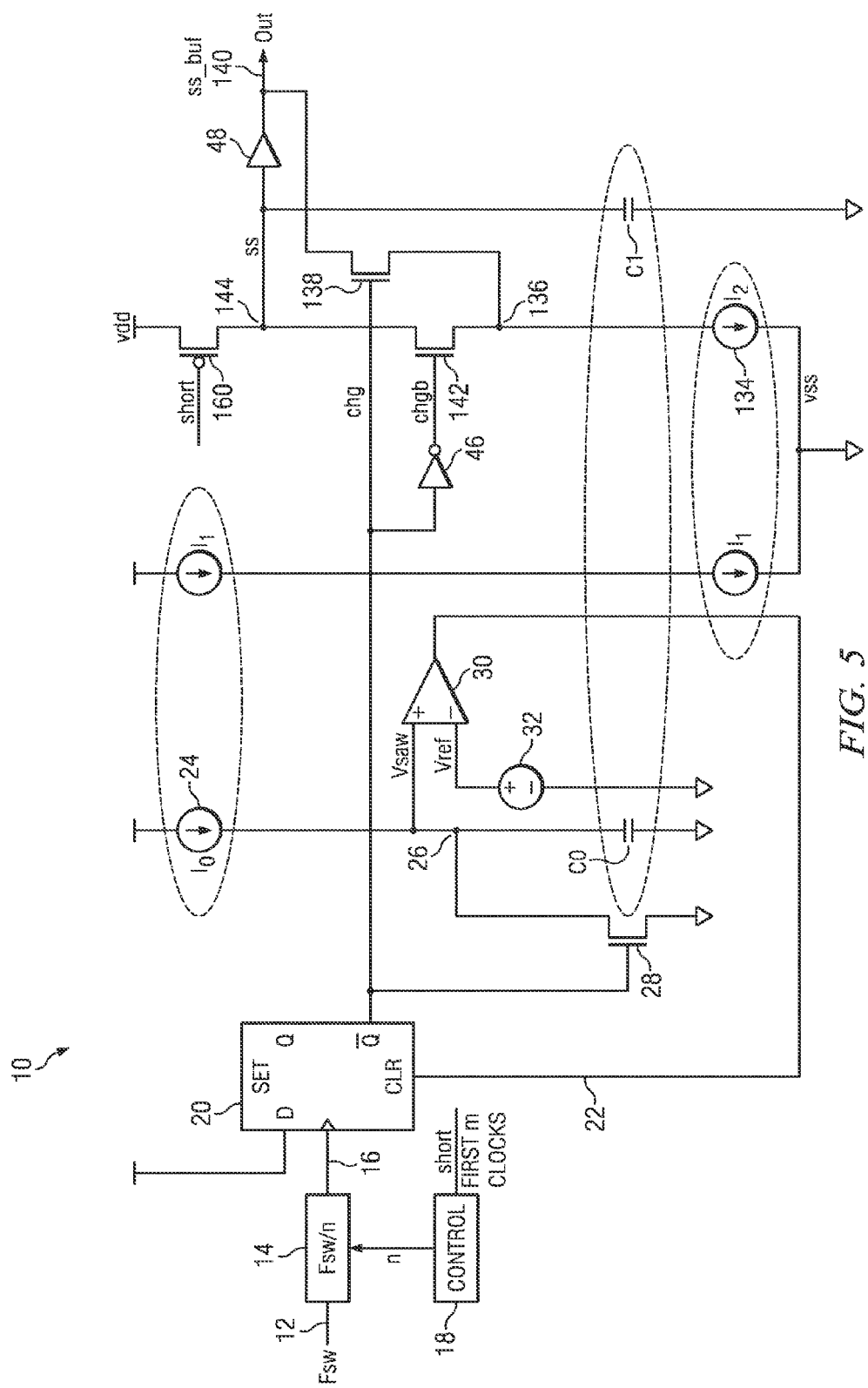
FIG. 5 is a circuit diagram of an alternative embodiment for a ramp generator circuit.

Although described above in terms of generating a rising ramp signal, the invention is no so limited and the concepts and implementation as described herein can alternatively be used to generate a falling ramp signal. Such a configuration would, instead of charging a capacitor as provided for generation of the rising ramp, instead operate to discharge a capacitor. In other words, the circuit would operate to generate a fixed pulse signal to discharge the capacitor. Such a configuration is shown in FIG. 5 where like references refer to same or similar parts. With respect to differences, the circuit of FIG. 5 includes a current source 134 operating as a current sink coupled between intermediate node 136 and the lower voltage reference (ground). The current source 134 may be implemented through a current mirroring arrangement as shown. A transistor 142 is source-drain coupled between the intermediate node 136 and node 44 (at which a non-buffered ramp signal ss is generated). A gate terminal of transistor 142 is coupled to receive the signal chgb from the Q(bar) output of the D-type flip flop circuit 20. A transistor 138 is source-drain coupled between the intermediate node 136 and node 140 (at which a buffered ramp signal ss_buf is generated). A gate terminal of transistor 138 is coupled to receive the signal chgb from the Q(bar) output of the D-type flip flop circuit 20. As illustrated, the signal chgb is generated by an inverter circuit 46 having an input coupled to receive the signal chg from the Q(bar) output of the D-type flip flop circuit 20. A transistor 160 is source-drain coupled between node 144 and a higher reference voltage (Vdd). A gate terminal of transistor 160 is coupled to receive a control signal "short" which turns on transistor 160 at the beginning of a cycle to charge capacitor C1 and produce a high output at the node 140. The "short" signal then turns off transistor 160 and the circuit operates to produce a negative ramp at the output node 140.

Figure 6:
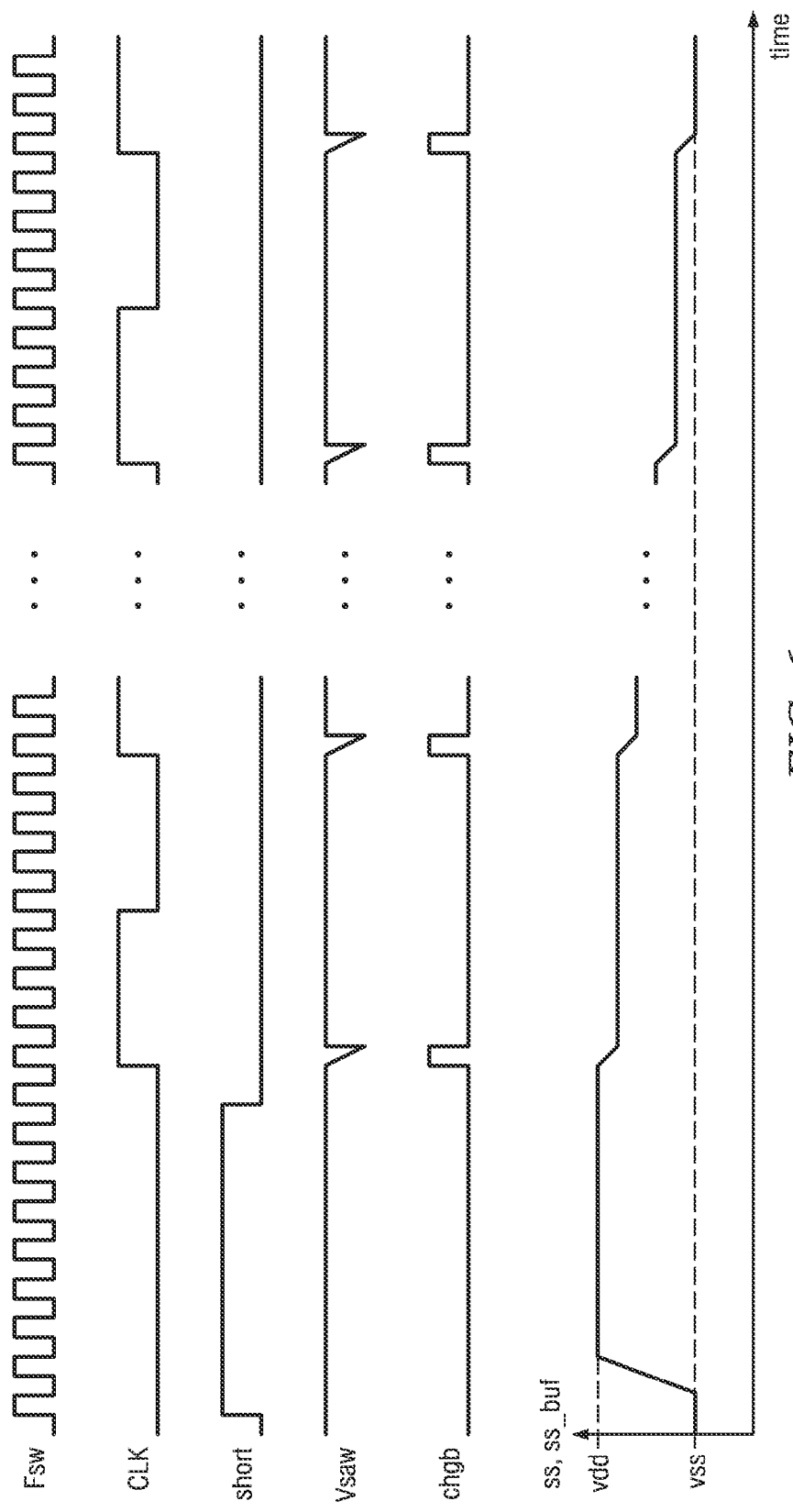
FIG. 6 is a timing diagram illustrating operation of the circuit of FIG. 5.

Operation of the circuit of FIG. 5 may be better understood with reference to the timing diagram shown in FIG. 6. The general operation is similar to that of the circuit of FIG. 1 (with reference to FIG. 2) except that periodic signals chgb and chg function to control the step-like discharge of the capacitor C1 (rather than an increase as in FIG. 1 circuit operation). Again, the circuit in FIG. 5, like the circuit in FIG. 1, operates in continuous mode. The choice of n by the control circuit 18 effectuates control over the slope of the falling ramp signal.

Additionally, although illustrated in FIG. 5 as generating a one-time ramp signal, those skilled in the art understand that the circuit could be used as a sawtooth waveform generator. In such an implementation, a sensing circuit would operate to sense falling of the output signal below a threshold and in response thereto activate the control signal "short" to turn on transistor 160 and begin a new cycle by charge the capacitor C1 back to the higher reference voltage. The circuitry for such an operation would be similar to the comparator and control feedback circuitry shown in FIG. 4 except that the comparison operation would be configured to sense falling of the output signal below a threshold.

It will be understood that the circuit implemented as a rising ramp generator can be used in a buck and boost soft-start circuit. It will further be understood that the circuit implemented as a falling ramp generator can be used in a buck-boost soft-start circuit.

The foregoing description has provided by way of exemplary and non-limiting examples a full and informative description of the exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
 a first current generator coupled to a first reference voltage node and configured to generate a first output current at a first intermediate node;
 a first transistor having a source-drain path coupled to receive the first output current at the first intermediate node and configured to apply the first output current to a second intermediate node in response to a periodic signal;

a second transistor having a source-drain path coupled to receive the first output current at the first intermediate node and configured to apply the first output current to an output node in response to a complement of the periodic signal;

a first capacitance coupled between the second intermediate node and a second reference voltage node and configured to generate a ramping signal at the second intermediate node in response to the first output current applied by the first transistor;

a buffer circuit having an input coupled to receive the ramping signal from the second intermediate node and having an output coupled to generate an output ramping signal at the output node;

a third transistor having a source-drain path coupled between the second intermediate node the second reference voltage node; and a comparator circuit having a first input coupled to the output node, a second input configured to receive a second threshold and an output configured to generate a signal for application to a gate of the third transistor.

2. The circuit of claim 1, further comprising an inverter circuit configured to generate the complement of the periodic signal.

3. The circuit of claim 1, further comprising a generator circuit configured to generate the periodic signal, said generator circuit comprising:
a logic circuit configured to sense an edge of a clock signal and change the periodic signal from a first logic state to a second logic state and further operable to respond to a reset signal and change the periodic signal from the second logic state back to the first logic state; and
a timing circuit configured to generate the reset signal.

4. The circuit of claim 3, wherein the logic circuit comprises a flip-flop circuit having a clock input configured to receive the clock signal, an output configured to generate the periodic signal, and a reset input configured to receive said reset signal.

5. The circuit of claim 4, further comprising:
a divider circuit having an input configured to receive a source clock signal and an output configured to generate the clock signal as a divided by n version of the source clock signal for application to the clock input.

6. The circuit of claim 5, further comprising a control circuit configured to supply a value for n to the divider circuit.

7. The circuit of claim 4, wherein the flip-flop circuit comprises a D-type flip-flop.

8. The circuit of claim 3, wherein the timing circuit comprises:
a second current generator coupled to the first reference voltage node and configured to source a second output current to a third intermediate node;
a fourth transistor having a source-drain path coupled between the third intermediate node the second reference voltage node, said fourth transistor having a gate configured to receive the periodic signal;
a second capacitance coupled between the third intermediate node and the second reference voltage node; and
a comparator circuit having a first input coupled to the third intermediate node, a second input configured to receive a first threshold and an output configured to generate the reset signal.

9. The circuit of claim 3, further comprising:
a divider circuit having an input configured to receive a source clock signal and an output configured to generate the clock signal as a divided by n version of the source clock signal.

10. The circuit of claim 9, further comprising a control circuit configured to supply a value for n to the divider circuit.

11. A circuit, comprising:
a first capacitor;
a first transistor;
a first current generator operable to source current to the first capacitor through the first transistor, wherein the first transistor is gate controlled by the complement of a periodic signal;
a buffer circuit configured to receive a ramping voltage stored on the first capacitor and generate a ramping output signal at an output node;
a second transistor configured to couple the output node to the first current generator, wherein the second transistor is gate controlled by the periodic signal;
a flip-flop having an output configured to generate the periodic signal from an input clock signal and a reset signal;
a second current source;
a second capacitor charged by the second current source;
a third transistor configured to discharge the second capacitor in response to the periodic signal;
a comparator circuit operable to compare a voltage on the second capacitor to a reference and generate the reset signal;
a fourth transistor configured to discharge the first capacitor in response to a control signal; and
an additional comparator circuit operable to compare a voltage on the first capacitor to an additional reference and generate the control signal.

12. The circuit of claim 11, further comprising:
a divider circuit having an input configured to receive a source clock signal and an output configured to generate the input clock signal as a divided by n version of the source clock signal.

13. The circuit of claim 12, further comprising a control circuit configured to supply a value for n to the divider circuit.

14. A circuit, comprising:
a first current generator operable to source current at a first node;
a first MOS transistor having a first conduction terminal connected to the first node and having a second conduction terminal connected to a second node, said first MOS transistor having a gate terminal configured to receive a first periodic signal;
a first capacitor having a first plate connected to the second node and a second plate connected to a supply node;
a buffer circuit having an input connected to the second node and an output connected to a third node; and
a second MOS transistor having a first conduction terminal connected to the first node and having a second conduction terminal connected to the third node, said second MOS transistor having a gate terminal configured to receive a second periodic signal;
a third MOS transistor having a first conduction terminal connected to the second node and having a second conduction terminal connected to the supply node, said third MOS transistor having a gate terminal configured to receive a control signal; and
a comparator circuit operable to compare a voltage on the first capacitor to a reference and generate the control signal.

15. The circuit of claim 14, wherein said second periodic signal is a complement of said first periodic signal.

16. The circuit of claim 14, further comprising an inverter circuit having an input configured to receive the second periodic signal and an output configured to generate the first periodic signal.

17. The circuit of claim 14, further comprising:
- a bistable circuit configured to generate a change signal in response to a clock signal and a reset signal, said first and second periodic signals being derived from said change signal;
- a second current generator operable to source current at a fourth node;
- a second capacitor having a first plate connected to the fourth node and a second plate connected to the supply node;
- a third MOS transistor having a first conduction terminal connected to the fourth node and having a second conduction terminal connected to the supply node, said third MOS transistor having a gate terminal configured to receive the change signal; and
- a comparator circuit operable to compare a voltage on the second capacitor to a reference and generate the reset signal.

18. The circuit of claim 17, wherein the bistable circuit comprises a flip-flop.

* * * * *